US009312440B2

United States Patent
Lo et al.

(10) Patent No.: US 9,312,440 B2
(45) Date of Patent: Apr. 12, 2016

(54) EPITAXY STRUCTURE OF A LIGHT EMITTING ELEMENT HAVING III-NITRIDE QUANTUM WELLS

(71) Applicant: NATIONAL SUN YAT-SEN UNIVERSITY, Kaohsiung (TW)

(72) Inventors: I-Kai Lo, Kaohsiung (TW); Yu-Chi Hsu, Kaohsiung (TW); Cheng-Hung Shih, Kaohsiung (TW); Wen-Yuan Pang, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 14/335,355

(22) Filed: Jul. 18, 2014

(65) Prior Publication Data
US 2015/0333222 A1    Nov. 19, 2015

(30) Foreign Application Priority Data

May 13, 2014    (TW) .............................. 103116856 A

(51) Int. Cl.
| | | |
|---|---|---|
| *H01L 29/06* | (2006.01) | |
| *H01L 33/20* | (2010.01) | |
| *H01L 33/06* | (2010.01) | |
| *H01L 33/32* | (2010.01) | |

(52) U.S. Cl.
CPC ................ *H01L 33/20* (2013.01); *H01L 33/06* (2013.01); *H01L 33/325* (2013.01)

(58) Field of Classification Search
CPC ..................... H01L 21/0254; H01L 21/02389; H01L 21/02458; H01L 21/02579; H01L 27/153; H01L 21/0245; H01L 21/02532; H01L 29/155; H01L 29/2003; H01L 33/007; H01L 33/20; H01L 33/38; H01L 33/06; H01L 33/325

USPC ......................................... 257/13, 14; 438/46
See application file for complete search history.

(56) References Cited

U.S. PATENT DOCUMENTS

| | | | |
|---|---|---|---|
| 2002/0048909 A1* | 4/2002 | Biwa ....................... C30B 25/02 | |
| | | | 438/483 |
| 2004/0057482 A1* | 3/2004 | Wang ............................... 372/45 | |
| 2007/0284564 A1* | 12/2007 | Biwa et al. ...................... 257/13 | |
| 2009/0098343 A1* | 4/2009 | Arena et al. .................. 428/172 | |
| 2010/0224857 A1* | 9/2010 | Soh et al. ......................... 257/13 | |
| 2013/0087780 A1* | 4/2013 | Chiou ............................. 257/43 | |
| 2013/0256722 A1* | 10/2013 | Yang et al. ...................... 257/98 | |
| 2014/0264260 A1* | 9/2014 | Chang .................. H01L 33/005 | |
| | | | 257/13 |

* cited by examiner

*Primary Examiner* — Duy T Nguyen

(74) *Attorney, Agent, or Firm* — Muncy, Geissler, Olds & Lowe, P.C.

(57) ABSTRACT

An epitaxy structure of a light emitting element includes a gallium nitride substrate, an N-type gallium nitride layer, a quantum well unit, and a P-type gallium nitride layer. The gallium nitride substrate includes a gallium nitride buffer layer, a gallium nitride hexagonal prism, and a gallium nitride hexagonal pyramid. The gallium nitride hexagonal prism extends from the gallium nitride buffer layer along an axis. The gallium nitride hexagonal pyramid extends from the gallium nitride hexagonal prism along the axis and gradually expands to form a hexagonal frustum. The N-type gallium nitride layer is located on the gallium nitride hexagonal pyramid. The quantum well unit includes an indium gallium nitride layer located on the N-type gallium nitride layer and a gallium nitride layer located on the indium gallium nitride layer. The P-type gallium nitride layer is located on the gallium nitride layer.

22 Claims, 3 Drawing Sheets

EPITAXY STRUCTURE OF A LIGHT EMITTING ELEMENT HAVING III-NITRIDE QUANTUM WELLS

The present application claims foreign priority to application TW 103116856 filed on May 13, 2014.

BACKGROUND OF THE INVENTION

1. Field of the Invention

The present invention relates to an epitaxy structure of a light emitting element and, more particularly, to an epitaxy structure of a light emitting element having III-nitride quantum wells.

2. Description of the Related Art

III-nitride semiconductors, including gallium nitride (GaN), indium gallium nitride (InGaN), and indium aluminum nitride (InAlN), possess characteristics of direct wide band gaps and, thus, can be used to produce light emitting elements, such as light emitting diodes or laser diodes, in which quantum well technique can increase the light emitting efficiency of the light emitting elements.

FIG. 1 shows conventional materials for light emitting elements and the grayscale distribution. Current industries use quaternary compounds (such as AlGaInP) to produce white light emitting diodes (LED) or use ternary compounds to produce blue light emitting diodes (LED) which can be used to make white light emitting diodes by adding fluorescent whitening agents. However, it is difficult to control the growth parameters of the quaternary compounds and, thus, difficult to obtain high-quality films. On the other hand, it is difficult to obtain rare earth elements contained in the light emitting elements using fluorescent whitening agents. Furthermore, heat is generated during conversion of energy, shortening the service life of the light emitting elements while consuming considerable energy.

Thus, it is necessary to solve the above drawbacks in the prior art to meet practical needs, thereby increasing the utility.

SUMMARY OF THE INVENTION

The primary objective of the present invention is to provide an epitaxy structure of a light emitting element such that the light emitting element can emit a blue light source, allowing use in production of a white light emitting element without using fluorescent whitening agents.

Another objective of the present invention is to provide an epitaxy structure of a light emitting element such that the color of the light source emitted from the light emitting element is a complementary color of blue, allowing use in production of a white light emitting element without using fluorescent whitening agents.

The present invention fulfills the above objectives by providing an epitaxy structure of a light emitting element including a gallium nitride substrate, an N-type gallium nitride layer, a quantum well unit, and a P-type gallium nitride layer. The gallium nitride substrate includes a gallium nitride buffer layer, a gallium nitride hexagonal prism, and a gallium nitride hexagonal pyramid. The gallium nitride hexagonal prism extends from the gallium nitride buffer layer along an axis. The gallium nitride hexagonal pyramid extends from the gallium nitride hexagonal prism along the axis and gradually expands to form a hexagonal frustum. The N-type gallium nitride layer is located on the gallium nitride hexagonal pyramid of the gallium nitride substrate. The quantum well unit includes an indium gallium nitride layer and a gallium nitride layer. The indium gallium nitride layer is located on the N-type gallium nitride layer. The gallium nitride layer is located on the indium gallium nitride layer. The P-type gallium nitride layer is located on the gallium nitride layer of the quantum well unit.

In an example, the indium gallium nitride layer is a film formed by an epitaxy of indium gallium nitride ($In_mGa_{1-m}N$, $0<m<1$), wherein m is between 0.15 and 0.18.

In another example, the indium gallium nitride layer is a film formed by an epitaxy of indium gallium nitride ($In_mGa_{1-m}N$, $0<m<1$), wherein m is between 0.19 and 0.23.

In a further example, m is equal to 0.22.

In an example, the gallium nitride layer of the quantum well unit includes a cap slice located on a side of the gallium nitride layer facing the indium gallium nitride layer.

In the example, the gallium nitride layer of the quantum well unit further includes a barrier slice located on another side of the gallium nitride layer opposite to the indium gallium nitride layer.

In the example, the barrier slice has a thickness larger than a thickness of the cap slice.

In the example, a gallium content of the barrier slice is larger than a gallium content of the cap slice.

In an example, the N-type gallium nitride layer is a film formed by gallium nitride doped with at least one of silicon and germanium.

In an example, the P-type gallium nitride layer is a film formed by gallium nitride doped with at least one of magnesium, beryllium, carbon, zinc, and calcium.

In an example, the axis is a c-axis of a wurtzite.

In another aspect, an epitaxy structure of a light emitting element includes a gallium nitride substrate, an N-type gallium nitride layer, a plurality of quantum well units, and a P-type gallium nitride layer. The gallium nitride substrate includes a gallium nitride buffer layer, a gallium nitride hexagonal prism, and a gallium nitride hexagonal pyramid. The gallium nitride hexagonal prism extends from the gallium nitride buffer layer along an axis. The gallium nitride hexagonal pyramid extends from the gallium nitride hexagonal prism along the axis and gradually expands to form a hexagonal frustum. The N-type gallium nitride layer is located on the gallium nitride hexagonal pyramid of the gallium nitride substrate. The plurality of quantum well units is stacked on each other. Each of the plurality of quantum well units includes an indium gallium nitride layer and a gallium nitride layer located on the indium gallium nitride layer, wherein the indium gallium nitride layer of one of two adjacent quantum well units adjoins the gallium nitride layer of another of the two adjacent quantum wells, and wherein the indium gallium nitride layer of one of the plurality of quantum well units not adjoining any gallium nitride layer is connected to the N-type gallium nitride layer. The P-type gallium nitride layer is located on the gallium nitride layer of one of the plurality of quantum well units not adjoining any indium gallium nitride layer.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where.

The present invention will become clearer in light of the following detailed description of illustrative embodiments of this invention described in connection with the drawings.

DETAILED DESCRIPTION OF THE INVENTION

The term "self-assembling" referred to herein means directly modulating the growth parameters (such as growth temperature, growing time, or element ratio) of a molecular beam epitaxy system during the epitaxy procedure of the element by molecular beam epitaxy to obtain the desired shape, structure, and constitution of the element without conducting any processing procedure (such as yellow light, lithography, and etching) on the substrate of the epitaxy, which can be appreciated by one having ordinary skill in the art.

Figure 1:
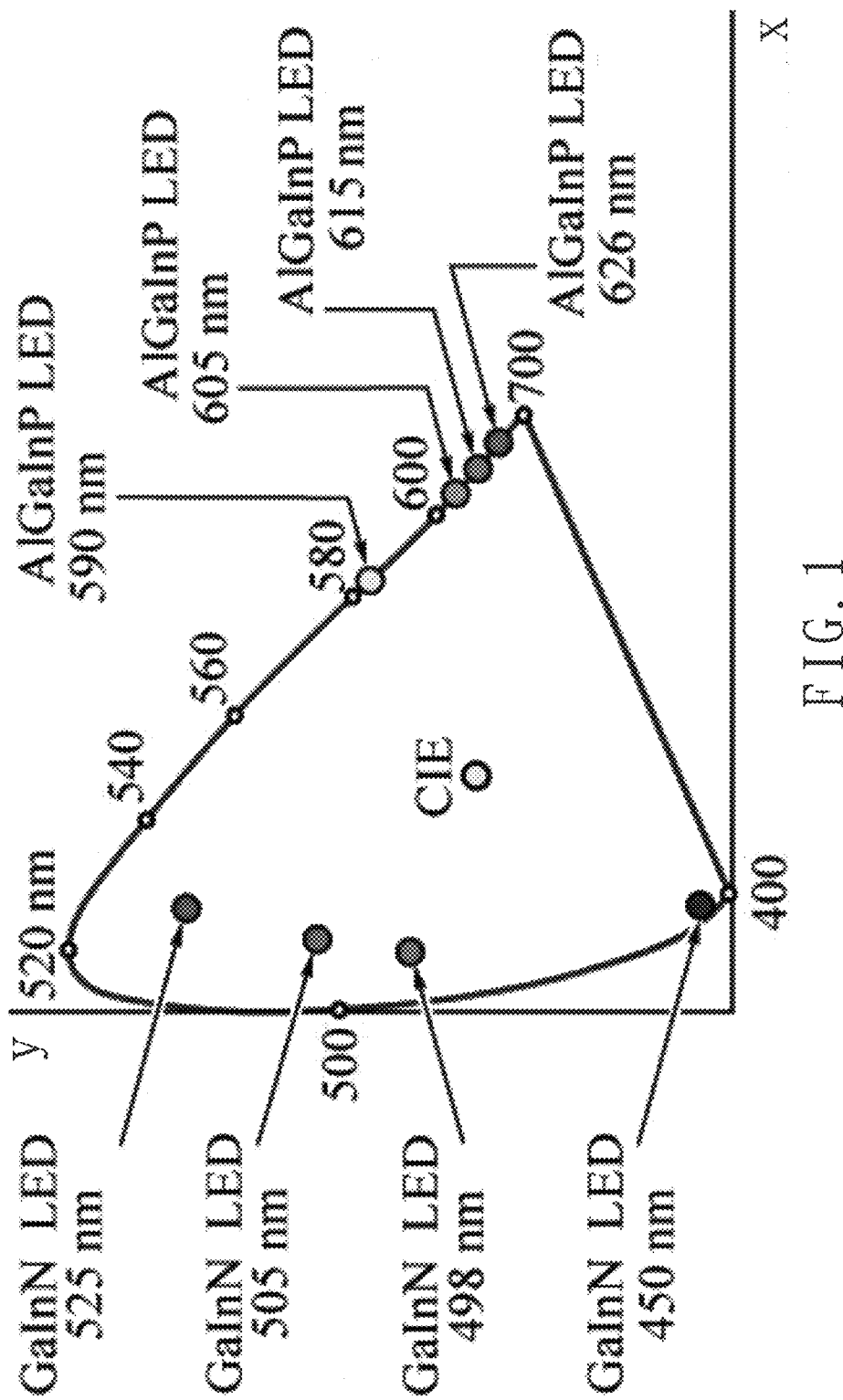
FIG. 1 is a schematic view illustrating the conventional materials for light emitting elements and the grayscale distribution.
Figure 2:
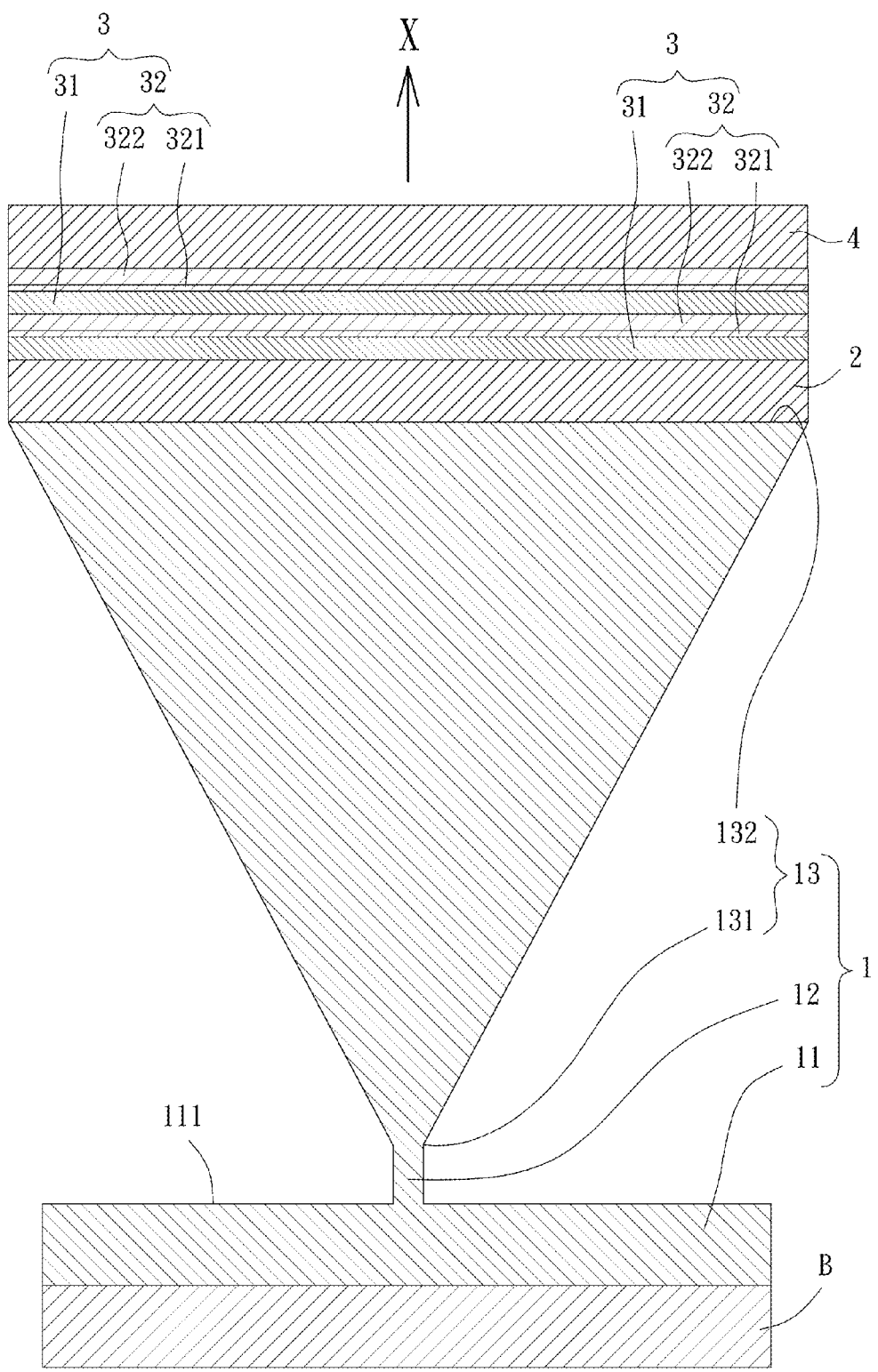
FIG. 2 is a cross sectional view of an epitaxy structure of a light emitting element according to the present invention.

The term "hexagonal frustum" referred to herein means a hexagonal pyramid originally having an apex and a bottom face is cut to remove the apex, with two opposite ends of the hexagonal pyramid respectively forming a cut end and a connection end. Each of the cut end and the connection end is hexagonal. An area of the cut end is smaller than that of the connection end. With reference to FIG. 2, a gallium nitride hexagonal pyramid 13 extends along an axis X and gradually expands to form a hexagonal frustum. The two opposite ends of the hexagonal frustum respectively form a cut end 131 and a connection end 132, which can be appreciated by one having ordinary skill in the art.

The term "wurtzite" referred to herein means a mineral structure of a hexagonal system, wherein the c-axis of the mineral structure is the [000-1] direction of a 4-axis coordinate system, which can be appreciated by one having ordinary skill in the art.

The term "complementary color" referred to herein means a color having a grayscale value that can combine with a grayscale value of another color to produce white, e.g., the grayscale value (R, G, B) of blue is (0, 0, 255), the complementary color of blue is yellow whose grayscale value (R, G, B) is (255, 255, 0), and the grayscale values of the two colors can be combined to produce white whose grayscale value (R, G, B) is (255, 255, 255), which can be appreciated by one having ordinary skill in the art.

The term "semiconductor" referred to herein means a material having a controllable conductivity in a range between a conductor and an insulating member (namely, the band gap is larger than 9 eV), such as silicon (Si), germanium (Ge), or gallium arsenide (GaAs), which can be appreciated by one having ordinary skill in the art.

The term "metalloids" referred to herein means an element having characteristics between metal and non-metal, such as silicon (Si) and germanium (Ge), which can be appreciated by one having ordinary skill in the art.

The term "electroluminescence effect" referred to herein means combination of an electron and a hole in a p-n junction of a light emitting element (LED) to emit light beams while an electric current flows through the p-n junction of the light emitting element, which can be appreciated by one having ordinary skill in the art.

FIG. 2 is a cross sectional view of an epitaxy structure of a light emitting element according to the present invention. The epitaxy structure of the light emitting element includes a gallium nitride substrate 1, an N-type gallium nitride layer 2, a quantum well unit 3, and a P-type gallium nitride layer 4. The gallium nitride substrate 1, the N-type gallium nitride layer 2, the quantum well unit 3, and the P-type gallium nitride layer 4 are connected face to face in sequence. In this embodiment, the gallium nitride substrate 1, the N-type gallium nitride layer 2, the quantum well unit 3, and the P-type gallium nitride layer 4 are formed according to the epitaxial growth in sequence.

Still referring to FIG. 2, the gallium nitride substrate 1 includes a gallium nitride buffer layer 11, a gallium nitride hexagonal prism 12, and a gallium nitride hexagonal pyramid 13. The gallium nitride hexagonal prism 12 extends from the gallium nitride buffer layer 11 along an axis X. The gallium nitride hexagonal pyramid 13 extends from the gallium nitride hexagonal prism 12 along the axis X and gradually expands to form a hexagonal frustum on which the N-type gallium nitride layer 2 is located. In this embodiment, the gallium nitride substrate 1 can be formed on a base B (such as $LiAlO_2$) by gallium nitride epitaxy. The gallium nitride buffer layer 11 can be a film formed by gallium nitride epitaxy. The gallium nitride hexagonal prism 12 extends from a surface 111 of the gallium nitride buffer layer 11 along the axis X and is in the form of a hexagonal prism. Preferably, the axis X is a c-axis of a wurtzite. The gallium nitride hexagonal pyramid 13 extends from the gallium nitride hexagonal prism 12 along the axis X and gradually expands to form the hexagonal frustum (namely, a gallium nitride three-dimensional epitaxy structure formed by self-assembling). The two opposite ends of the hexagonal frustum respectively form a cut end 131 and a connection end 132. The connection end 132 is used for epitaxial growth of the N-type gallium nitride layer 2.

Still referring to FIG. 2. The N-type gallium nitride layer 2 is located on the connection end 132 of the gallium nitride hexagonal pyramid 13 of the gallium nitride substrate 1. Preferably, the N-type gallium nitride layer 2 is a film formed by gallium nitride doped with at least one of silicon (Si) and germanium (Ge), such that most of the carriers in the N-type gallium nitride layer 2 are electrons, serving as an N-type semiconductor of the light emitting element. In this embodiment, since silicon can be obtained more easily than germanium, the N-type gallium nitride layer 2 is gallium nitride doped with silicon. The N-type gallium nitride layer 2 has a thickness in a range between 100 nm and 200 nm. However, the thickness of the N-type gallium nitride layer 2 is not limited to this range.

Still referring to FIG. 2, the quantum well unit 3 is located on the N-type gallium nitride layer 2 and includes an indium gallium nitride layer 31 and a gallium nitride layer 32. The indium gallium nitride layer 31 is located on the N-type gallium nitride layer 2. The gallium nitride layer 32 is located on the indium gallium nitride layer 31. The indium gallium nitride layer 31 is a film formed by an epitaxy of indium gallium nitride ($In_mGa_{1-m}N$, $0<m<1$). A ratio of the nitrogen (N) content in the indium gallium nitride layer 31 to a sum of the indium (In) content and the gallium (Ga) content is 1:1. Adjustment of the indium content can change the color of the light emitted. In an example, if m is between 0.15 and 0.18, the indium content is about 15-18% of the sum of the indium content and the gallium content (In/InGa*100), and the gallium content is about 82-85% of the sum of the indium content and the gallium content (Ga/InGa*100). This can be used to emit blue light (the wavelength is 450-495 nm, the energy level is 2.51-2.76 eV). In another example, if m is between 0.19 and 0.23 (preferably 0.22), the indium content is about 19-23% (preferably 22%) of the sum of the indium content and the gallium content (In/InGa*100), and the gallium content is about 77-81% (preferably 78%) of the sum of the indium content and the gallium content (Ga/InGa*100). This can be used to emit a light (the wavelength is 495-590 nm, the energy level is 2.10-2.51 eV) having a color complementary to blue, such as yellow or green light.

Still referring to FIG. 2, the gallium nitride layer 32 is located on the gallium nitride layer 32. Preferably, the gallium nitride layer 32 includes a cap slice 321 located on a side of the gallium nitride layer 32 facing the indium gallium nitride layer 31, such that the cap slice 321 adjoins the indium gallium nitride layer 31. A nitrogen to gallium ratio of the cap slice 321 of the gallium nitride layer 32 is larger than a nitrogen to gallium ratio in the remaining portion of the gallium nitride layer 32, avoiding indium in the indium gallium nitride layer 31 from escape during formation of the gallium nitride layer 32. Preferably, the gallium nitride layer 32 further includes a barrier slice 322 located on the other side of the gallium nitride layer 32 opposite to the indium gallium nitride layer 31. The gallium content in the barrier slice 322 is larger than the gallium content in the cap slice 321. Furthermore, the barrier slice 322 has a thickness larger than a thickness of the cap slice 321 to cover the cap slice 321.

By such an arrangement, the P-type gallium nitride layer 4 can be provided on the gallium nitride layer 32 of the quantum well unit 3. The epitaxy structure of a light emitting element according to the present invention can include a single quantum well (SQW). Alternatively, the indium gallium nitride layer 31 of another well 3 can be provided on the gallium nitride layer 32, and the P-type gallium nitride layer 4 is provided on the gallium nitride layer 32 of the other quantum well 3. In a case that a plurality of quantum wells 3 is provided, the quantum wells 3 are stacked on each other, wherein the indium gallium nitride layer 31 of one of two adjacent quantum well units 3 adjoins the gallium nitride layer 32 of the other of the two adjacent quantum wells 3, the indium gallium nitride layer 31 of one of the quantum well units 3 not adjoining any gallium nitride layer 32 is connected to the N-type gallium nitride layer 2, and the P-type gallium nitride layer 4 is located on the gallium nitride layer 32 of one of the quantum well units 3 not adjoining any indium gallium nitride layer 31. The number of the quantum wells 3 is preferably 5 in this embodiment to increase the light emitting efficiency while avoiding high manufacturing costs.

Still referring to FIG. 2, the P-type gallium nitride layer 4 is located on the gallium nitride layer 32 of the quantum well unit 3. Preferably, the P-type gallium nitride layer 4 is a film formed by gallium nitride doped with at least one of magnesium (Mg), beryllium (Be), carbon (C), zinc (Zn), and calcium (Ca), such that most of the carriers in the P-type gallium nitride layer 4 are electrons, serving as a P-type semiconductor of the light emitting element. In this embodiment, the P-type gallium nitride layer 4 is gallium nitride doped with magnesium and has a thickness in a range between 100 nm and 200 nm. However, the thickness of the P-type gallium nitride layer 4 is not limited to this range.

Figure 3:
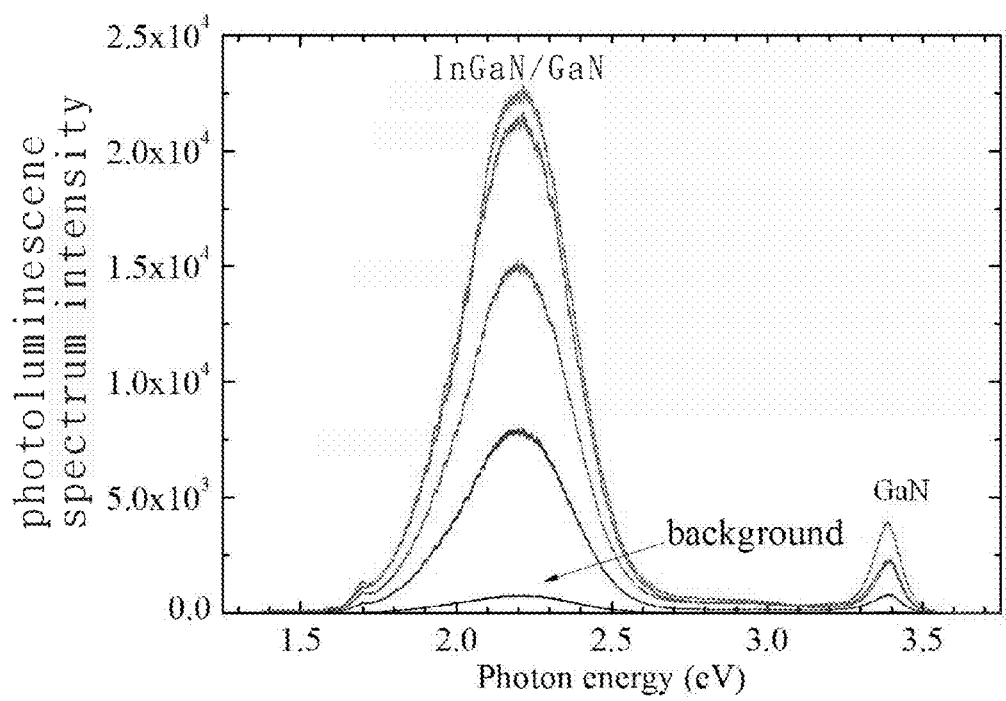
FIG. 3 is a diagram illustrating photoluminescence spectrum intensity of the epitaxy structure of a light emitting element according to the present invention.
Figure 4:
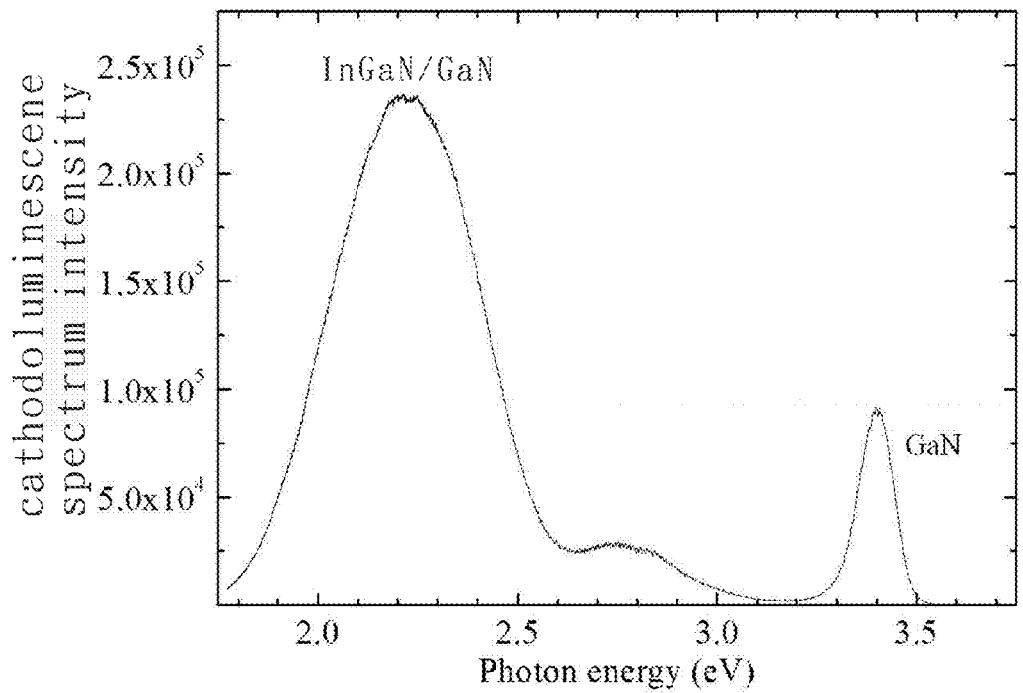
FIG. 4 is a diagram illustrating cathodoluminescence spectrum intensity of the epitaxy structure of a light emitting element according to the present invention.

FIGS. 3 and 4 respectively show photoluminescence spectrum intensity and cathodoluminescence spectrum intensity of the epitaxy structure of a light emitting element according to the present invention. To inspect the characteristics of the epitaxy structure of a lighting element according to the present invention, photoluminescence (PL) spectrum and cathodoluminescence (CL) spectrum can be used to analyze the optical characteristics of the samples. Specifically, due to the influence of quantum confinement effect, the signal intensity of yellow light InGaN/GaN having a photon energy of about 2.2 eV is far stronger than that of blue light GaN having a photon energy of about 3.4 eV. Thus, the epitaxy structure of a light emitting element according to the present invention can adjust the indium content in the indium gallium nitride layer 31 to allow the light emitting element to emit blue light or its complementary light (yellow light), and, thus, can be used to produce a white light emitting element. Thus, it is not necessary to use fluorescent whitening agents to make the light emitting element emit white light. The costs for the fluorescent whitening agent can be saved while increasing the light emitting efficiency.

The epitaxy structure of a light emitting element according to the present invention can be used to produce light emitting elements (such as light emitting diodes). In practice, a positive terminal of a direct current power source is electrically connected to the P-type gallium nitride layer 4, and a grounding terminal of the direct current power source is electrically connected to the N-type gallium nitride layer 2. The epitaxy structure of a light emitting element according to the present invention converts the electrical energy into light energy (such as blue light or yellow light) by electroluminescence effect, and the light energy is then used to produce white light. The operational principle can be appreciated by one having ordinary skill in the art. Redundant description is not desired.

According to the above technical solution, the main features of the epitaxy structure of a light emitting element according to the present invention includes the gallium nitride substrate 1, the N-type gallium nitride layer 2, the quantum well unit 3, and the P-type gallium nitride layer 4. The gallium nitride substrate 1, the N-type gallium nitride layer 2, the quantum well unit 3, and the P-type gallium nitride layer 4 are connected face to face in sequence. The gallium nitride substrate 1 includes the gallium nitride buffer layer 11, the gallium nitride hexagonal prism 12, and the gallium nitride hexagonal pyramid 13. The gallium nitride hexagonal prism 12 extends from the gallium nitride buffer layer 11 along an axis X. The gallium nitride hexagonal pyramid 13 extends from the gallium nitride hexagonal prism 12 along the axis X and gradually expands to form the hexagonal frustum. The N-type gallium nitride layer 2 is located on the gallium nitride hexagonal pyramid 13 of the gallium nitride substrate 1. The quantum well unit 3 includes the indium gallium nitride layer 31 and the gallium nitride layer 32. The indium gallium nitride layer 31 is located on the N-type gallium nitride layer 2, and the gallium nitride layer 32 is located on the indium gallium nitride layer 31. The P-type gallium nitride layer 4 is located on the gallium nitride layer 32 of the quantum well unit 3.

A ratio of the nitrogen (N) content in the indium gallium nitride layer 31 to a sum of the indium (In) content and the gallium (Ga) content is 1:1. Adjustment of the indium content can change the color of the light emitted. In an example, if the indium content is about 15-18% of the sum of the indium content and the gallium content (In/InGa*100), and the gallium content is about 82-85% of the sum of the indium content and the gallium content (Ga/InGa*100). This can be used to emit blue light (the wavelength is 450-495 nm, the energy level is 2.51-2.76 eV). In another example, if the indium content is about 19-23% (preferably 22%) of the sum of the indium content and the gallium content (In/InGa*100), and the gallium content is about 77-81% (preferably 78%) of the sum of the indium content and the gallium content (Ga/InGa*100). This can be used to emit a light (the wavelength is 495-590 nm, the energy level is 2.10-2.51 eV) having a color complementary to blue, such as yellow or green light.

Thus, the epitaxy structure of a light emitting element according to the present invention can adjust the indium content in the indium gallium nitride layer 31 to allow the light emitting element to emit blue light or its complementary light (yellow light), and, thus, can be used to produce a white light emitting element without using fluorescent whitening agents required in conventional techniques. The costs can be saved, and the light emitting efficiency is increased.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. An epitaxy structure of a light emitting element comprising:
   a gallium nitride substrate including a gallium nitride buffer layer, a gallium nitride hexagonal prism, and a gallium nitride hexagonal pyramid, with the gallium nitride hexagonal prism extending from the gallium nitride buffer layer along an axis, with the gallium nitride hexagonal pyramid extending from the gallium nitride hexagonal prism along the axis and gradually expanding to form a hexagonal frustum;
   an N-type gallium nitride layer located on the gallium nitride hexagonal pyramid of the gallium nitride substrate;
   a quantum well unit including an indium gallium nitride layer and a gallium nitride layer, with the indium gallium nitride layer located on the N-type gallium nitride layer, and with the gallium nitride layer located on the indium gallium nitride layer; and
   a P-type gallium nitride layer located on the gallium nitride layer of the quantum well unit.

2. The epitaxy structure of a light emitting element as claimed in claim 1, wherein the indium gallium nitride layer is a film formed by an epitaxy of indium gallium nitride ($In_mGa_{1-m}N$, $0<m<1$), and wherein m is between 0.15 and 0.18.

3. The epitaxy structure of a light emitting element as claimed in claim 1, wherein the indium gallium nitride layer is a film formed by an epitaxy of indium gallium nitride ($In_mGa_{1-m}N$, $0<m<1$), and wherein m is between 0.19 and 0.23.

4. The epitaxy structure of a light emitting element as claimed in claim 3, wherein m is equal to 0.22.

5. The epitaxy structure of a light emitting element as claimed in claim 1, wherein the gallium nitride layer of the quantum well unit includes a cap slice located on a side of the gallium nitride layer facing the indium gallium nitride layer.

6. The epitaxy structure of a light emitting element as claimed in claim 5, wherein the gallium nitride layer of the quantum well unit further includes a barrier slice located on another side of the gallium nitride layer opposite to the indium gallium nitride layer.

7. The epitaxy structure of a light emitting element as claimed in claim 6, wherein the barrier slice has a thickness larger than a thickness of the cap slice.

8. The epitaxy structure of a light emitting element as claimed in claim 6, wherein a gallium content of the barrier slice is larger than a gallium content of the cap slice.

9. The epitaxy structure of a light emitting element as claimed in claim 1, wherein the N-type gallium nitride layer is a film formed by gallium nitride doped with at least one of silicon and germanium.

10. The epitaxy structure of a light emitting element as claimed in claim 1, wherein the P-type gallium nitride layer is a film formed by gallium nitride doped with at least one of magnesium, beryllium, carbon, zinc, and calcium.

11. The epitaxy structure of a light emitting element as claimed in claim 1, wherein the axis is a c-axis of a wurtzite.

12. An epitaxy structure of a light emitting element comprising:
    a gallium nitride substrate including a gallium nitride buffer layer, a gallium nitride hexagonal prism, and a gallium nitride hexagonal pyramid, with the gallium nitride hexagonal prism extending from the gallium nitride buffer layer along an axis, with the gallium nitride hexagonal pyramid extending from the gallium nitride hexagonal prism along the axis and gradually expanding to form a hexagonal frustum;
    an N-type gallium nitride layer located on the gallium nitride hexagonal pyramid of the gallium nitride substrate;
    a plurality of quantum well units stacked on each other, with each of the plurality of quantum well units including an indium gallium nitride layer and a gallium nitride layer located on the indium gallium nitride layer, wherein the indium gallium nitride layer of one of two adjacent quantum well units adjoins the gallium nitride layer of another of the two adjacent quantum well units, and wherein the indium gallium nitride layer of one of the plurality of quantum well units not adjoining any gallium nitride layer is connected to the N-type gallium nitride layer; and
    a P-type gallium nitride layer located on the gallium nitride layer of one of the plurality of quantum well units not adjoining any indium gallium nitride layer.

13. The epitaxy structure of a light emitting element as claimed in claim 12, wherein the indium gallium nitride layer is a film formed by an epitaxy of indium gallium nitride ($In_mGa_{1-m}N$, $0<m<1$), and wherein m is between 0.15 and 0.18.

14. The epitaxy structure of a light emitting element as claimed in claim 12, wherein the indium gallium nitride layer is a film formed by an epitaxy of indium gallium nitride ($In_mGa_{1-m}N$, $0<m<1$), and wherein m is between 0.19 and 0.23.

15. The epitaxy structure of a light emitting element as claimed in claim 14, wherein m is equal to 0.22.

16. The epitaxy structure of a light emitting element as claimed in claim 12, wherein the gallium nitride layer of each of the plurality of quantum well units includes a cap slice located on a side of the gallium nitride layer facing the indium gallium nitride layer.

17. The epitaxy structure of a light emitting element as claimed in claim 16, wherein the gallium nitride layer of each of the plurality of quantum well units further includes a barrier slice located on another side of the gallium nitride layer opposite to the indium gallium nitride layer.

18. The epitaxy structure of a light emitting element as claimed in claim 17, wherein the barrier slice has a thickness larger than a thickness of the cap slice.

19. The epitaxy structure of a light emitting element as claimed in claim 17, wherein a gallium content of the barrier slice is larger than a gallium content of the cap slice.

20. The epitaxy structure of a light emitting element as claimed in claim 12, wherein the N-type gallium nitride layer is a film formed by gallium nitride doped with at least one of silicon and germanium.

21. The epitaxy structure of a light emitting element as claimed in claim 12, wherein the P-type gallium nitride layer is a film formed by gallium nitride doped with at least one of magnesium, beryllium, carbon, zinc, and calcium.

22. The epitaxy structure of a light emitting element as claimed in claim 12, wherein the axis is a c-axis of a wurtzite.

* * * * *